United States Patent [19]

Kitaoka

[11] Patent Number: 5,373,177
[45] Date of Patent: Dec. 13, 1994

[54] SEMICONDUCTOR DEVICE WITH IMPROVED ELECTRIC CHARGE STORAGE CHARACTERISTICS

[75] Inventor: Nobuyasu Kitaoka, Hiroshima, Japan
[73] Assignee: NEC Corporation, Tokyo, Japan
[21] Appl. No.: 128,210
[22] Filed: Sep. 29, 1993
[30] Foreign Application Priority Data
Oct. 1, 1992 [JP] Japan ................ 4-286745
[51] Int. Cl.⁵ .......................... H01L 29/92
[52] U.S. Cl. .................. 257/306; 257/509; 257/648; 257/296
[58] Field of Search .......... 257/509, 306, 648, 296; 437/69, 70

[56] References Cited
FOREIGN PATENT DOCUMENTS

| | | | |
|---|---|---|---|
| 55-22856 | 2/1980 | Japan | 437/70 |
| 63-15438 | 1/1988 | Japan | 257/509 |
| 1-241142 | 9/1989 | Japan | 437/70 |
| 3-204969 | 6/1991 | Japan | |

*Primary Examiner*—Robert P. Limanek
*Attorney, Agent, or Firm*—Young & Thompson

[57] ABSTRACT

A semiconductor device such as a DRAM is provided, in which a channel stop region of a first conductive type is formed in a semiconductor substrate just below a field insulator. The channel stop region comprises a first part and a second part higher in impurity concentration than the first part. An impurity-doped region such as a source/drain region of an MOS transistor, which is of a second conductive type opposite in polarity to the first conductive type, is in contact with the first part but is not in contact with the second part in the substrate. A leakage current through a p-n junction between the channel stop region and the impurity-doped region can be reduced and as a result, reliability of operation can be improved.

6 Claims, 5 Drawing Sheets

F I G. 2
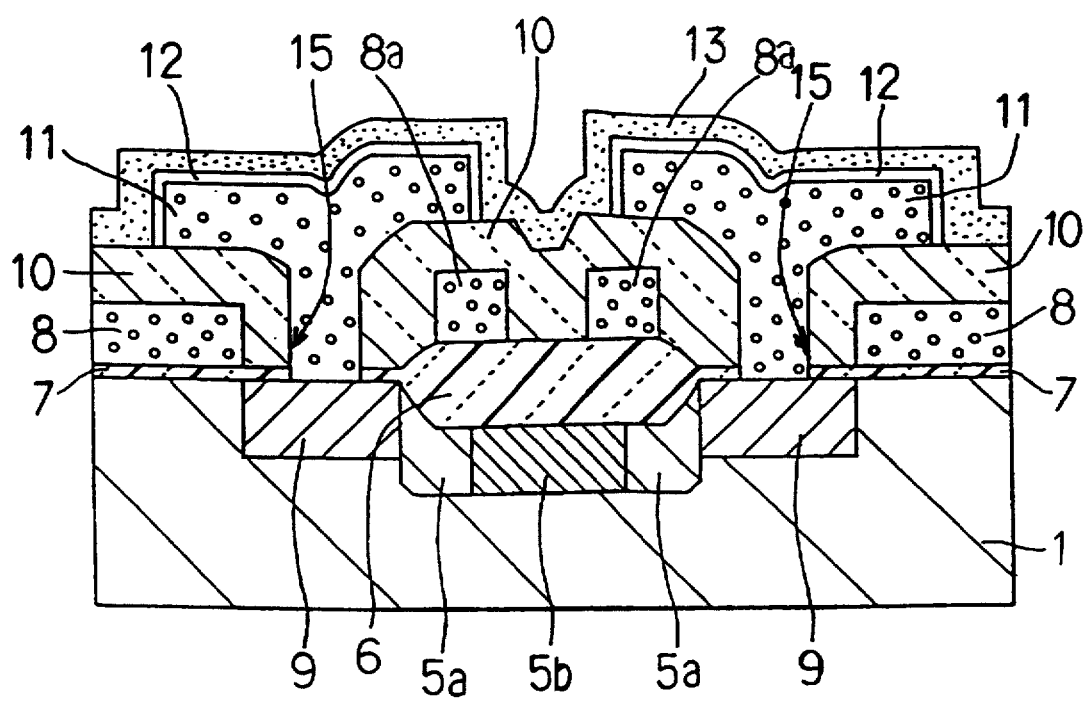

SEMICONDUCTOR DEVICE WITH IMPROVED ELECTRIC CHARGE STORAGE CHARACTERISTICS

BACKGROUND OF THE INVENTION

1. Field of the Invention

The present invention relates to a semiconductor device and more particularly, to a semiconductor device having a field insulator and a channel stop for device isolation.

2. Description of the Prior Art

FIG. 1B is a partial cross-section of a memory cell array of a conventional Dynamic Random Access Memory (DRAM) in which each cell has the stacked-capacitor structure, and FIG. 1A is a partial cross-section of the cell shown in FIG. 1B to explain its fabrication process. Here, only the storage node side of the memory cell is shown for the sake of simplification of illustration.

In FIG. 1B, a patterned field oxide 26 for device isolation is formed on the surface of a p-type silicon substrate 21, and a $p^+$-type diffusion layer 25 with a high impurity concentration serving as a channel stop is formed just below the field oxide 26 in the substrate 21.

Within each active region formed by the field oxide 26, a metal-oxide-semiconductor (MOS) transistor is formed. The MOS transistor is composed of a gate electrode 28 formed on a gate oxide 27, an n-type diffusion layer 29 and an n-type diffusion layer (not shown) in the same active region, both of the diffusion layers forming a pair of source/drain regions. A patterned polysilicon film serving as the gate electrodes 28 is also serves as word lines 28a on the field oxide 26. As shown FIG. 1B, the n-type diffusion layer 29 is directly contacted with the $p^+$-type diffusion layer 25 as the channel stop in the substrate 21.

The surface of the gate electrode 28 and the exposed surfaces of the gate oxide 27 and the field oxide 26 are covered with an interlayer insulator film 30, and on the interlayer insulator film 30, a lower electrode 31 forming an electric charge storage capacitor is formed. The lower electrode 31 has its lower end in contact with the surface of the n-type diffusion layer 29 through a contact hole 35 in the interlayer insulator film 30. Thus, the lower electrode 31 is electrically connected to the n-type diffusion layer 29.

The entire surface of the lower electrode 31 is covered with a dielectric 32 forming the storage capacitor. The surface of the dielectric 32 and the exposed surface of the interlayer insulator film 30 are covered with a common upper electrode 33 forming the respective storage capacitors. The surface of the upper electrode 33 is covered with a passivation layer (not shown).

The conventional DRAM having the above-mentioned configuration is fabricated as follows:

First, a silicon dioxide film 22 and a silicon nitride film 23 are formed on the surface of the p-type silicon substrate 21 in this order and then, a photoresist film 24 is formed on the silicon nitride film 23. After the photoresist film 24 is patterned to the predetermined shape, the silicon nitride film 23 and the silicon dioxide film 22 are patterned by using the photoresist film 24 as a mask, which at this stage is shown in FIG. 1A.

Next, without removing the photoresist film 24, boron ions are selectively implanted into the substrate 21 at an acceleration energy of 100 keV with a dose of $1 \times 10^{13}/cm^2$. Thus the $p^+$-type diffusion layer 25 as the channel stop is formed, as shown in FIG. 1A. Subsequently, the photoresist film 24 is removed.

A silicon dioxide film for the field oxide 26 is formed over the entirety of the substrate 21 by a wet thermal oxidation method, and then the silicon nitride film 23 and the silicon dioxide film 22 are removed by etching. Thus, the silicon dioxide film is selectively left on an isolation region of the substrate 21, in which the field oxide 26 is in contact with the surface of the substrate 21, resulting in the patterned field oxide 26. The active regions are formed by the field oxide 26 thus patterned. After the gate oxide 27 is formed on the surface of each of the active regions, a phosphorus-doped polysilicon film is formed on the gate oxides 27 and the field oxide 26. The polysilicon film is then patterned to form the gate electrodes 28 and the word lines connected to each other. N-type dopant ions are selectively implanted into the substrate 21 through the gate oxides 27 using the field oxide 26 and the gate electrodes 28 as a mask thereby to form the n-type diffusion layers 29. Thus, a pair of the source/drain regions made of the n-type diffusion layers 29 is formed in each active region. The n-type diffusion layer 29 can be formed by the following three ways. By a first way, an $n^{30}$-type diffusion layer is formed by an ion-implantation process at a high level dose. By a second way, an n-type diffusion layer with the Lightly Doped Drain (LDD) structure is formed by using a side wall oxide. By a third way, an $n^-$-type diffusion layer is formed by an ion-implantation process at a low level dose and then, an $n^+$-type diffusion layer is formed in the $n^-$-type diffusion layer in contacting with the lower electrode 31 of the capacitor through the contact hole 35 of the interlayer insulator film 30.

Next, the interlayer insulator film 30 is deposited on the field oxides 26, the gate oxides 27 and the gate electrodes 28 and then, the contact holes 35 are formed in the interlayer insulator film 30 by photolithography and etching processes. As a result, the surfaces of the n-type diffusion layers 29 are partially exposed.

A polysilicon film is deposited on the interlayer insulator film 30 and patterned to form the lower electrodes 31, each of which is in contact with each n-type diffusion layer 29 through each contact hole 35.

A dielectric film is formed on the surfaces of the lower electrodes 31 and an exposed surface of the interlayer insulator film 30 by a thermal oxidation or a Chemical Vapor Deposition (CVD) method, and patterned to form the dielectric 32. Then, a polysilicon film is deposited on the dielectric 32 and the interlayer insulator film 30, and patterned to form the common upper electrode 33. The surface of the upper electrode 33 is covered with the passivation film (not shown). Thus, the conventional DRAM is obtained.

With the memory cell of the conventional DRAM, the $p^+$-type diffusion layer 25 as the channel stop is formed by an ion-implantation process of many dopants, so that it usually contains many defects. Besides, the $p^+$-type diffusion layer 25 is directly contacted with the n-type diffusion layer 29 as the source/drain region in the substrate 21. Therefore, a large leakage current can easily flow through the p-n junction formed by the $p^+$-diffusion layer 25 and the n-type diffusion layer 29. Accordingly, the electric charges stored in the storage capacitor are remarkably reduced and as a result, there arise some problems such as reversal of data. This means that it is difficult to ensure to storing the electric charge which is necessary for the normal operation of the memory in the capacitor.

If the impurity concentration of the p+-type diffusion layer 25 is reduced, the leakage current flowing through the p-n junction can be reduced, however, the layer 25 does not function as a channel stop sufficiently. As a result, there arises another problem that a leakage current flowing through a parasitic MOS transistor is increased.

SUMMARY OF THE INVENTION

An object of the present invention is to provide a semiconductor device in which a leakage current flowing through a p-n junction between a channel stop and an impurity-doped region formed adjacent the channel stop can be reduced.

Another object of the present invention is to provide a semiconductor device in which reliability of operation is improved.

According to a first aspect of the present invention, a semiconductor device is provided, which comprises a first impurity-doped region of a first conductive type which serves as a channel stop and is formed below a field insulator in a semiconductor substrate, and a second impurity-doped region of a second conductive type opposite in polarity to the first conductive type. The first impurity-doped region has a first part which is in contact with the second impurity-doped region and a second part which is not in contact with the second impurity-doped region. The first part is lower in impurity concentration than the second part. The second part has a sufficient impurity concentration to prevent an inversion layer from lining formed below the field insulator in the substrate.

With the semiconductor device according to the first aspect of the present invention, the second impurity-doped region is in contact with the first part of the first impurity-doped region smaller in impurity concentration and defects, so that a leakage current flowing through a p-n junction between the first and second impurity-doped regions can be reduced compared with the prior art semiconductor device as described above.

On the other hand, since the channel stop function is carried out by the second part of the first impurity-doped region, a leakage current flowing through a parasitic MOS transistor is not increased.

As a result, reliability of operation of the semiconductor device can be improved.

In a preferred embodiment, the second impurity-doped region is a source/drain region of an MOS transistor of a DRAM memory cell with a stacked capacitor. The source/drain region is electrically connected to one of a pair of electrodes of the capacitor. In this case, the electric charge storage characteristic of the cell is improved due to reduction of the leakage current, so that the operation reliability of the cell can be increased.

To make such a device, a first part of a first impurity-doped region for making a channel stop is formed by selectively introducing an impurity of a first conductive type into a semiconductor substrate, and a second part of the first impurity-doped region is formed by selectively introducing an impurity of the first conductive type into the substrate. The second part is higher in impurity concentration than the first part. A field insulator is formed on the substrate above the first and second parts. A second impurity-doped region of a second conductive type opposite in polarity to the first conductive type is formed so as to be in contact with the first part and not in contact with the second part.

The second part has a sufficient impurity concentration for preventing an inversion layer from being formed below the field insulator in the substrate.

Either of the first and second parts of the first impurity-doped region may be produced first. However, in a preferred embodiment, the step of forming the first part is carried out and then, the step of forming the second part is carried out by selectively introducing an impurity of the first conductive type into the first part.

With this fabrication method, the semiconductor device can be easily obtained.

BRIEF DESCRIPTION OF THE DRAWINGS

FIG. 2 is a partial cross-section of a memory cell array of a DRAM according to a first embodiment of the present invention.

DETAILED DESCRIPTION OF THE PREFERRED EMBODIMENTS

Figure 1A:
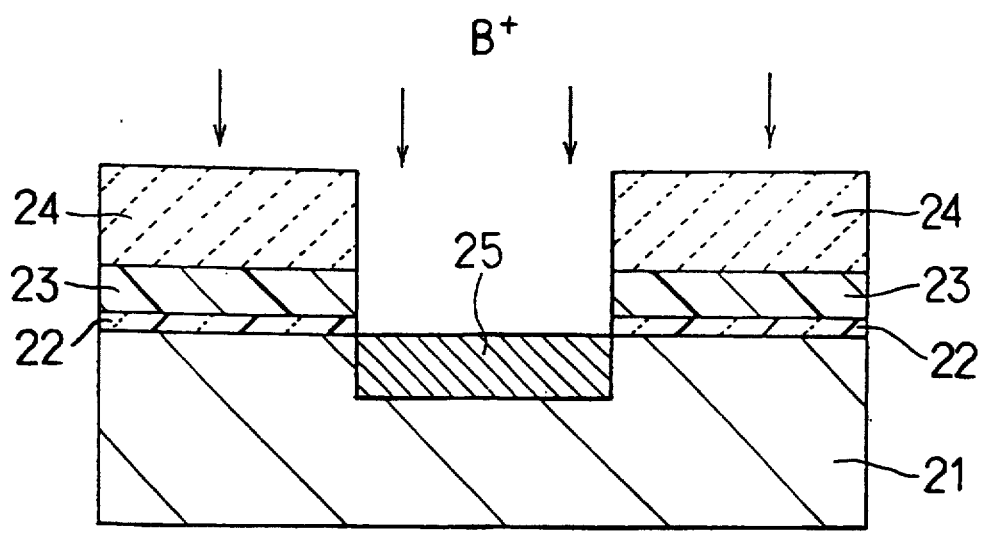
FIG. 1A is a partial cross-section for explaining a fabrication process of a memory cell array of a prior art DRAM.

Preferred embodiments of the present invention will be described below referring to FIGS. 2, 3A to 3C, 4 and 5A to 5C.

[First Embodiment]

In FIG. 2, a memory cell of a DRAM of a first embodiment of the present invention is comprised of an MOS transfer transistor and a capacitor for electric charge storage stacked over the transistor. In FIG. 2, a source/drain region on a storage node side of the transistor is shown, and another source/drain region on a bit line side thereof is not shown for simplification of illustration.

A patterned field oxide 6 for device isolation is formed on a main surface of a p-type silicon substrate 1, and a p⁻-type diffusion layer 5a and a p+-type diffusion layer 5b are formed in the substrate 1 just below the field oxide 6. The diffusion layers 5a and 5b together serve as a channel stop. The p+-type diffusion layer 5b formed in the center is higher in impurity concentration than the p⁻-type diffusion layer 5a formed so as to surround the layer 5b.

Figure 1B:
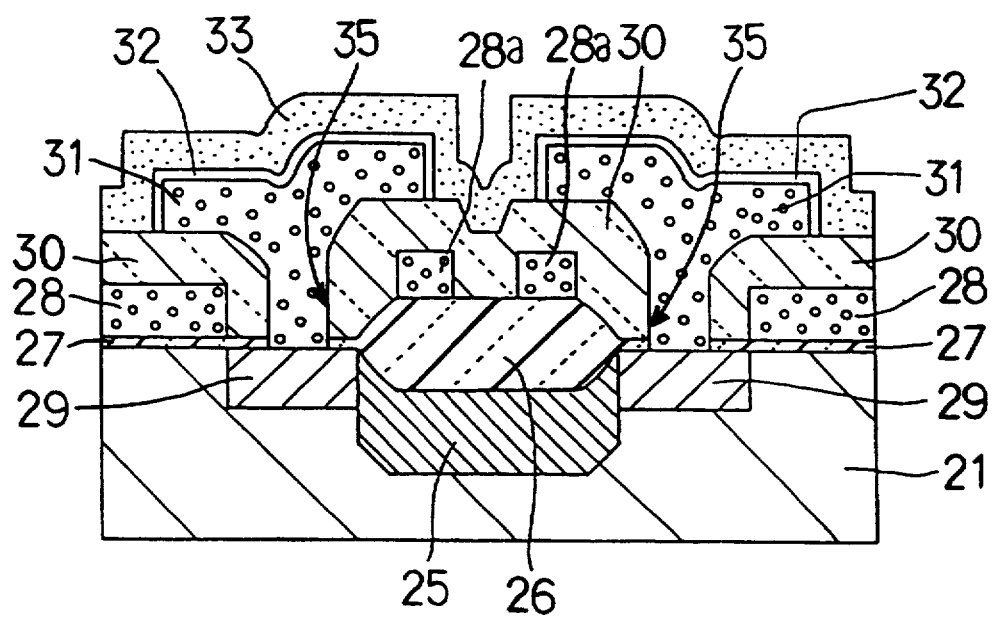
FIG. 1B is a partial cross-section of the memory cell array of the prior art DRAM.

As described later, the impurity concentration of the inside diffusion layer 5b is higher than that of the diffusion layer 25 of the prior art DRAM shown in FIG. 1B, and the impurity concentration of the outside diffusion layer 5a is lower than that of the diffusion layer 25.

In each of the active regions formed by the field oxide 6, an MOS transistor is formed. The MOS transistor is composed of a gate electrode 8 formed on a gate oxide 7 and an n-type diffusion layer 9 and another n-type diffusion layer (not shown) formed in the substrate 1, both of the diffusion layers forming a pair of source/-drain regions.

A patterned polysilicon film serving as the gate electrodes 8 on the gate oxides 7 is also serves as word lines 8a on the field oxide 6. The gate electrodes 8 are connected to the word lines 8a, respectively. The n-type diffusion layer 9 is in direct contact with the outside p⁻-type diffusion layer 5a but is not in contact with the inside p⁺-type diffusion layer 5b in the substrate 1.

The surface of the gate electrodes 8 and the exposed surfaces of the gate oxides 7 and the field oxide 6 are covered with an interlayer insulator film 10. On the interlayer insulator film 10, lower electrodes 11 comprising the respective storage capacitors are formed, each of the electrodes 11 being in contact with each of the n-type diffusion layers 9 through each contact hole 15. Thus, the lower electrodes 11 are electrically connected to the n-type diffusion layers 9, respectively.

Each of the lower electrodes 11 has a surface entirely covered with a dielectric 12 for forming each capacitor. The surfaces of the dielectrics 12 and the exposed surface of the interlayer insulator film 10 are covered with a common upper electrode 13 for forming the respective capacitors. The surface of the upper electrode 13 is covered with a passivation film (not shown).

Figure 3A:
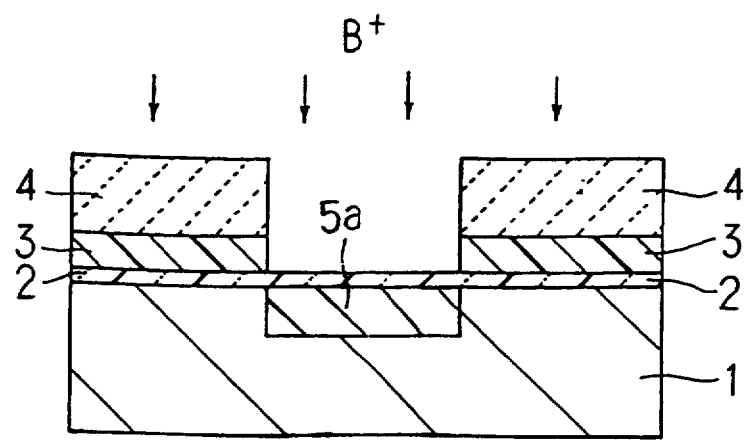
FIGS. 3A to 3C are partial cross-sections for explaining successive steps of a fabrication method according to a first embodiment of the present invention, respectively.

The memory cell having the above-mentioned configuration is fabricated as follows:

First, a silicon dioxide film 2 with a thickness of 400 Å is formed on the surface of the p-type silicon substrate 1 by a thermal oxidation method and then, a silicon nitride film 3 with a thickness of 1000 Å is formed on the silicon dioxide film 2 by a plasma-enhanced Chemical Vapor Deposition (CVD) method. Next, a photoresist film 4 is formed on the silicon nitride film 3 and patterned to obtain an isolation region of the predetermined shape. The silicon nitride film 3 is selectively removed by etching using the photoresist film 4 as a mask, which at this stage is shown in FIG. 3A.

Subsequently, without removing the patterned photoresist film 4, boron ions are selectively implanted into the substrate 1 at an acceleration energy of 100 key with a dose of $4 \times 10^{12}/cm^2$. Thus, the p⁻-type diffusion layer 5a lower in impurity concentration serving as a channel stop is formed, as shown in FIG. 3A.

Figure 3B:
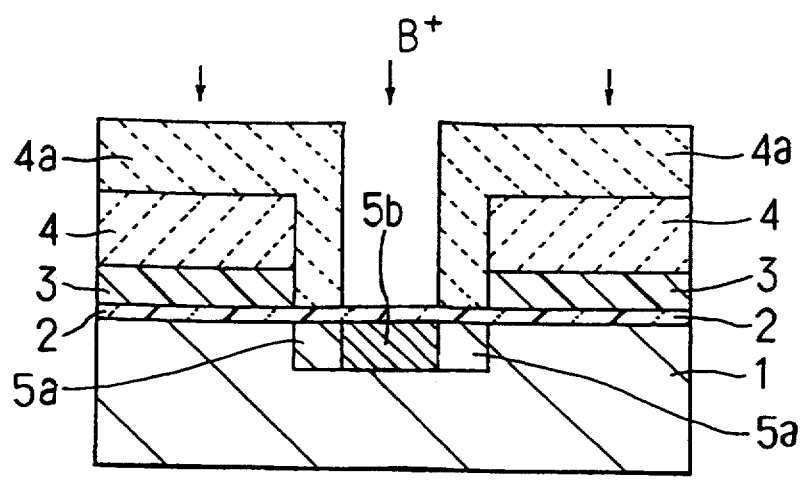

Another photoresist film 4a is formed on the photoresist film 4 and patterned so that holes are formed above the central portions of the p⁻-type diffusion layers 5a in the isolation region, respectively, as shown in FIG. 3B. Then, using the photoresist film 4a as a mask, boron ions are selectively implanted into the p⁻-type diffusion layers 5a at an acceleration energy of 100 key with a dose of $1 \times 10^{13}/cm^2$. Thus, the p⁺-type diffusion layers 5b higher in impurity concentration serving as the channel stops are formed in the p⁻-type diffusion layers 5a, respectively. As shown in FIG. 3B, each of the p⁺-type diffusion layers 5b is surrounded by each of the p⁻-type diffusion layers 5a, and the depths of the layers 5a and 5b are substantially the same. After the photoresist films 4 and 4a are removed, a silicon dioxide film with a thickness of 6000 Å is formed on the silicon nitride film 3 over the entirety of the substrate 1 by a wet thermal oxidation method. The silicon nitride film 3 and the silicon dioxide film 2 are removed by etching, then, the silicon dioxide film with the thickness of 6000 Å is selectively left on the isolation region of the substrate 1, resulting in the patterned field oxide 1 for forming the active regions.

Figure 3C:
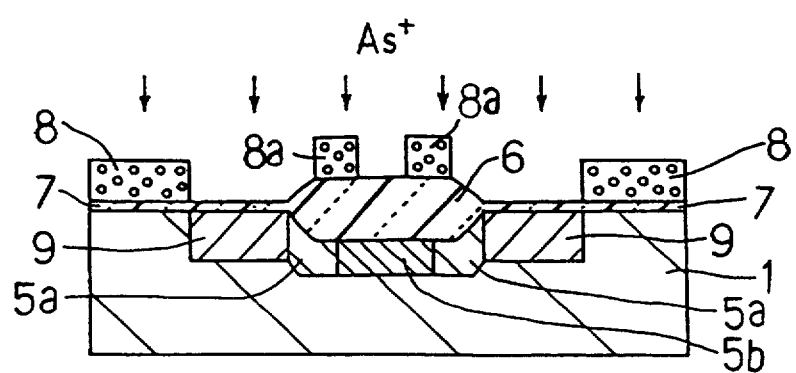

After the gate oxide 7 is formed on the surface of each of the active regions by a thermal oxidation method, a polysilicon film with a thickness of 3000 Å is formed on the gate oxides 7 and the field oxide 26 and is doped with phosphorus by a CVD method to reduce its electric resistance. The polysilicon film is patterned to form the gate electrodes 8 and the word lines 8a which are connected to each other by photo lithography and etching, which at this stage is shown in FIG. 3C.

Then, arsenic ions are selectively implanted into the substrate 1 through the gate oxides 7 by using the field oxide 6 and the gate electrodes 8 as a mask at an acceleration energy of 50 keV with a dose of $1 \times 10^5/cm^2$ thereby to form the n-type diffusion layers 9. Thus, a pair of the source/drain regions is formed by the n-type diffusion layers 9 in each active region. As shown in FIG. 3C, the source/drain regions on the storage node side are in contact with the p⁻-type diffusion layers 5a, but are not in contact with the p⁺-type diffusion layers 5b, respectively.

As shown in FIG. 2, the interlayer insulator film 10 with a thickness of 4000 Å is deposited on the field oxides 6, the gate oxides 7 and the gate electrodes 8 by a CVD method, and then, the contact holes 15 are formed in the interlayer insulator film 10 by photolithography and etching processes to partially expose the surfaces of the n-type diffusion layers 9.

A phosphorus-doped polysilicon film with a thickness of 5000 Å is deposited on the interlayer insulator film 10 by a CVD method and patterned to form the lower electrodes 11 of the capacitors. Each lower electrode 11 is in contact with each n-type diffusion layer 9 through each contact hole 15.

A dielectric film with a thickness of 100 Å is formed on the lower electrodes 11 and the interlayer insulator film 10 by a CVD method, and patterned to form the dielectric 32. Then, a phosphorus-doped polysilicon film with a thickness of 2000 Å is deposited on the dielectric 12 and the interlayer insulator film 10, and patterned to form the common upper electrode 13. The surface of the upper electrode 33 is covered with the passivation film (not shown). Thus, the DRAM with the above-identified configuration is obtained.

Each memory cell of the DRAM, is provided with the p⁺-type diffusion layer 5b with a higher impurity concentration and the p⁻-type diffusion layer 5a with a lower impurity concentration formed surrounding the p⁺-type diffusion layer 5b, and the n-type diffusion layer 9 comprising the storage node is in contact with the p⁻-type diffusion layer 5a but is not in contact with the p⁺-type diffusion layer 5b. Therefore, compared with a memory cell of the above-mentioned prior art DRAM, a leakage current flowing from the capacitor to the substrate 1 through the p-n junction between the p⁻-type diffusion layer 5a and the n-type diffusion layer 9 is reduced.

In addition, the channel stop function is reliably performed by the p⁺-type diffusion layer 5b with a higher impurity concentration than that of the prior art p⁺-type diffusion layer 25.

As a result, the electric charge storage characteristic of the cell can be improved, which means that its reliability of operation can be increased.

Figure 4:
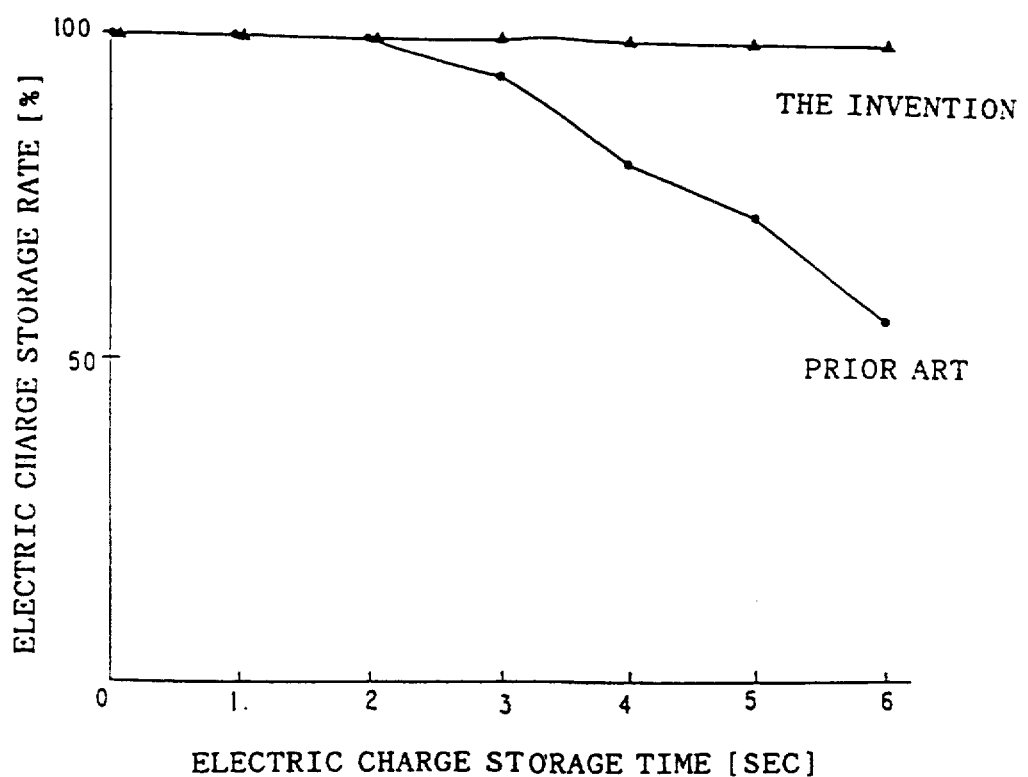
FIG. 4 is a graph showing charge storage characteristics of the memory cell arrays of the DRAMs of the prior art and the first embodiment.

FIG. 4 shows measurement results of the memory cells of the prior art and the present invention as to their electric charge storage characteristics. In this figure, the horizontal axis indicates the electric charge storage time, and the vertical axis indicates the electric charge storage rate with the initially stored electric charge value being as 100%.

It can be seen from FIG. 4 that the electric charge storage ratio decreases to 56% in 6 in the prior art and that it is maintained at 98% even after 6 seconds in the present invention.

[Second Embodiment]

Figure 5A:
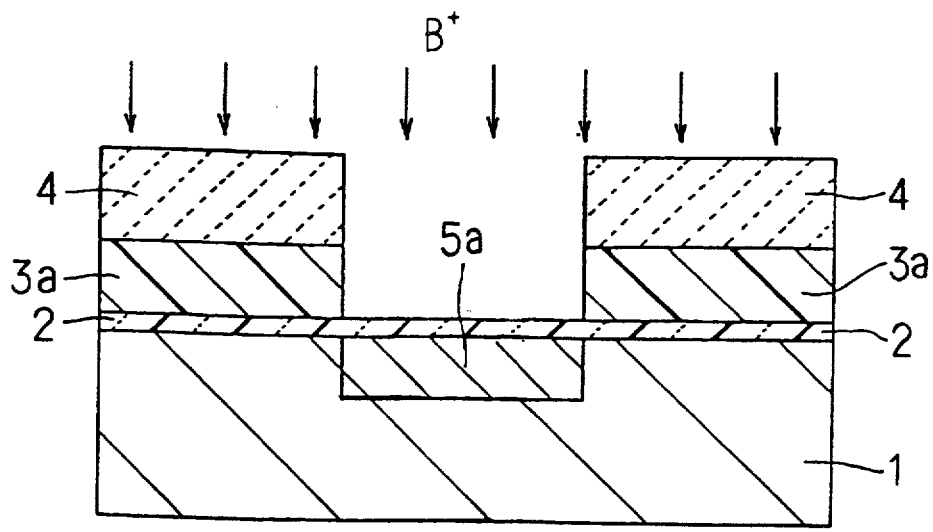
FIGS. 5A to 5C are partial cross-sections for explaining successive steps of a fabrication method according to a second embodiment of the present invention, respectively.
Figure 5B:
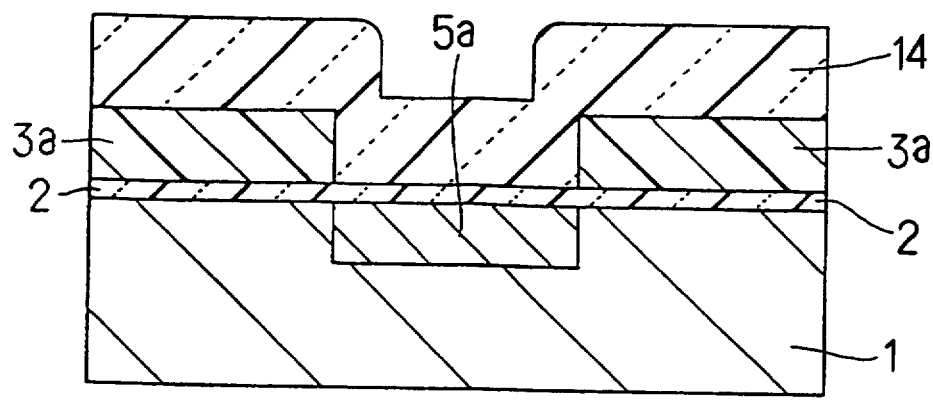
Figure 5C:
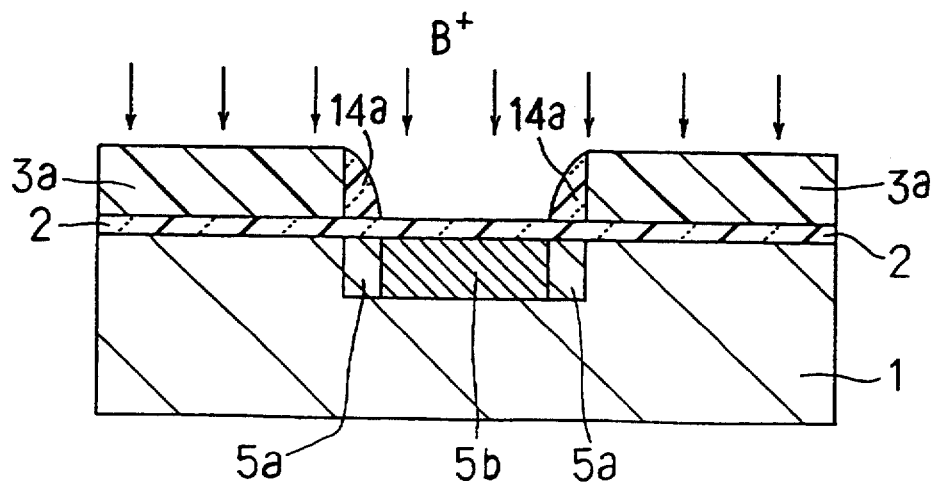

FIGS. 5A to 5C show a fabrication method of a second embodiment of the present invention. In FIGS. 5A to 5C, the same reference numerals are attached to elements corresponding to those in the first embodiment, respectively. A DRAM obtained by the method of the second embodiment is substantially the same in configuration as the first embodiment.

First, a silicon dioxide film 2 with a thickness of 400 Å is formed on the surface of the p-type silicon substrate 1 by a thermal oxidation method and then, a silicon nitride film 3a with a thickness of 3000 Å is formed on the silicon dioxide film 2 by a plasma-enhanced CVD method. Next, after a photoresist film 4 is formed on the silicon nitride film 3a, the film 3a is selectively removed by etching using the photoresist film 4 as a mask thereby to provide openings formed in the isolation region.

The above-mentioned steps are the same as those in the first embodiment other than that the silicon nitride film 3a is thicker than the silicon nitride film 3 in the first embodiment.

Subsequently, as shown in FIG. 5A, without removing the patterned photoresist film 4, boron ions are selectively implanted into the substrate 1 at an acceleration energy of 100 kev with a dose of $2 \times 10^{12}$/cm$^2$. Thus, the p$^-$-type diffusion layer 5a lower in impurity concentration serving as part of the channel stop is formed.

After the photoresist film 4 is removed, a silicon dioxide film 14 with a thickness of 5000 Å is formed on the silicon nitride film 3a by a CVD method, which at this stage is shown in FIG. 5B. The surface of the silicon nitride film 3a as well as the exposed surface of the silicon dioxide film 2 are covered with the silicon dioxide film 14 in FIG. 5B.

The silicon dioxide film 14 is then etched back to be removed at the surface of the silicon nitride film 3a and left at the side surface of the film 3a inside of its openings; thus a side wall oxide 14a is formed in each opening of the film 3a, as shown in FIG. 5C.

Then, using the silicon nitride film 3a and the side wall oxides 14a as a mask, boron ions are selectively implanted into the p$^-$-type diffusion layers 5a at an acceleration energy of 100 keV with a dose of $1 \times 10^{13}$/cm$^2$. Thus, the p$^+$-type diffusion layers 5b higher in impurity concentration serving as channel stops are formed in the p$^-$-type diffusion layers 5a, respectively. The side wall oxides 14a are then removed by wet etching.

Subsequent steps such as formation of the field oxide 6 are the same as those in the first embodiment.

In the second embodiment, since the silicon nitride film 3a is used as the mask in the first and second ion-implantation steps, it is required to be made thicker than the silicon nitride film 3 in the first embodiment, however, there is an advantage that the number of the photolithography steps can be reduced by one.

Preferred embodiments are described here, however, the present invention is not restricted to these embodiments and its various alterations are possible.

For example, a polycide film or silicide film may be used as the gate electrode instead of the polysilicon film. As a dielectric of the stacked capacitor, an oxide film obtained by thermal oxidation or a composite film including a silicon nitride film may be used instead of the oxide film obtained by a CVD method. The n-type diffusion layer 9 may have the LDD structure or the Double Diffused Drain (DDD) structure, and may be an n$^-$-type diffusion layer with a lower impurity concentration.

In the above-mentioned embodiments, sets of the p$^-$-diffusion layer 5a and the p$^+$-diffusion layer 5b as the channel stops are provided adjacent to the source/drain region on the bit line side of the MOS transistor as well as that on the storage node side thereof, respectively. However, the p$^+$-diffusion layer 5b alone may be used as the channel stop adjacent to the source/drain region on the bit line side. The same may be said about peripheral circuits of the DRAM.

In the above embodiments, the p$^-$-diffusion layer 5a and the p$^+$-diffusion layer 5b different in impurity concentration from each other are provided to form a channel stop, however, three or more diffusion layers different in impurity concentration from each other may be provided.

Besides, if the same effects can be obtained, the boundary of the diffusion layers 5a and 5b is not required to be clear cut. For example, the impurity concentration of a peripheral part of the channel stop, which is in contact with the source/drain region, could be low and the impurity concentration of the rest of the channel stop could increas gradually or continuously.

In the above embodiments, the p$^+$-diffusion layer 5b is formed after the p$^-$-diffusion layer 5a is formed, however, it may be formed prior to formation of the p$^-$-diffusion layer 5a.

What is claimed is:

1. A semiconductor device comprising:
   a semiconductor substrate;
   a field insulator for device isolation formed on a surface of said substrate;
   a first impurity-doped region of a first conductive type which serves as a channel stop, said first impurity-doped region being formed below said field insulator in said substrate; and
   a second impurity-doped region of a second conductive type opposite in polarity to said first conductive type, said second impurity-doped region being formed adjacent to said first impurity-doped region in said substrate;
   wherein said first impurity-doped region has a first part which is in contact with said second impurity-doped region and a second part which is not in contact with said second impurity-doped region, and said first part is lower in impurity concentration than said second part; and
   said second part has a sufficient impurity concentration for preventing an inversion layer from being formed below said field insulator in said substrate;
   an electric charge storage capacitor having lower and upper electrodes and a dielectric;
   said lower electrode being formed over said second impurity-doped region and being electrically connected to said second impurity-doped region;
   said dielectric being formed on said lower electrode; and
   said higher electrode being formed on said dielectric;

whereby the electric charge storage characteristics of said capacitor are improved.

2. A semiconductor device as claimed in claim 1, wherein said first part is formed to surround said second part.

3. A semiconductor device as claimed in claim 1, wherein said second impurity-doped region is a source/drain region of an MOS transistor.

4. A semiconductor device comprising:
a semiconductor substrate;
a field insulator for device isolation formed on a surface of said substrate;
a channel stop region of a first conductive type, said first channel stop region being formed below said field insulator in said substrate;
a source/drain region of an MOS transistor formed adjacent to said channel stop region in said substrate, said source/drain region being of a second conductive type opposite in polarity to said first conductive type; and
an electric charge storage capacitor having lower and upper electrodes and a dielectric, said capacitor being formed over said substrate through an interlayer insulator;
wherein said lower electrode of said capacitor is electrically connected to said source/drain region, said channel stop region has a first part which is in contact with said source/drain region and a second part which is not in contact with said source/drain region, and said first part is lower in impurity concentration than said second part; and
said second part has a sufficient impurity concentration to prevent an inversion layer from being formed below said field insulator in said substrate;
whereby said electric storage characteristics of said capacitor are improved.

5. A semiconductor device as claimed in claim 4, wherein said first part is formed to surround said second part.

6. A semiconductor device as claimed in claim 4, wherein two of said source/drain regions and two of said capacitors are provided, and said two of source/drain regions are formed on either side of said channel stop region in contact with said first part of said channel stop region.

* * * * *